United States Patent
Xie et al.

(10) Patent No.: US 9,741,893 B2
(45) Date of Patent: Aug. 22, 2017

(54) AMORPHOUS SILICON PHOTOELECTRIC DEVICE AND FABRICATING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenyu Xie, Beijing (CN); Xu Chen, Beijing (CN); Shaoying Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/357,722

(22) PCT Filed: Aug. 23, 2013

(86) PCT No.: PCT/CN2013/082185
§ 371 (c)(1),
(2) Date: May 12, 2014

(87) PCT Pub. No.: WO2014/153921
PCT Pub. Date: Oct. 2, 2014

(65) Prior Publication Data
US 2015/0179869 A1   Jun. 25, 2015

(30) Foreign Application Priority Data
Mar. 29, 2013 (CN) .......................... 2013 1 0110174

(51) Int. Cl.
*H01L 21/00* (2006.01)
*H01L 31/18* (2006.01)
(Continued)

(52) U.S. Cl.
CPC ...... *H01L 31/1804* (2013.01); *H01L 27/1443* (2013.01); *H01L 27/14603* (2013.01);
(Continued)

(58) Field of Classification Search
CPC .................... H01L 27/14659; H01L 27/14692
(Continued)

(56) References Cited

U.S. PATENT DOCUMENTS

2004/0115857 A1* 6/2004 Possin ............... H01L 27/14623
438/57
2006/0001120 A1 1/2006 Wright
(Continued)

FOREIGN PATENT DOCUMENTS

CN    101427387 A    5/2009
CN    102790067 A    11/2012
(Continued)

OTHER PUBLICATIONS

International Search Report Issued 101 9, 2014, Appln. No. PCT/CN2013-082185.
(Continued)

*Primary Examiner* — Hsin-Yi Hsieh
(74) *Attorney, Agent, or Firm* — Ladas & Parry LLP; Loren K. Thompson

(57) ABSTRACT

An amorphous-silicon photoelectric device and a fabricating method thereof are disclosed. The amorphous-silicon photoelectric device includes: a substrate; a thin-film transistor and a photosensor with the photodiode structure, which are provided at different positions on the substrate; and a contact layer; in which the contact layer is located below the
(Continued)

photosensor, and the contact layer is partially covered by the photosensor, moreover, the contact layer and the gate-electrode layer in the thin-film transistor are provided in a same layer and of a same material. According to the technical solutions of the present disclosure, the fabricating procedure of an a-Si photoelectric device can be simplified, thereby improving the fabrication efficiency and reducing costs.

12 Claims, 13 Drawing Sheets

(51) Int. Cl.
  *H01L 27/146*  (2006.01)
  *H01L 27/144*  (2006.01)
  *H01L 31/0376*  (2006.01)

(52) U.S. Cl.
  CPC .. *H01L 27/14676* (2013.01); *H01L 27/14687* (2013.01); *H01L 27/14692* (2013.01); *H01L 31/03762* (2013.01)

(58) Field of Classification Search
  USPC .......................................................... 438/59
  See application file for complete search history.

(56) References Cited

U.S. PATENT DOCUMENTS

| | | |
|---|---|---|
| 2006/0033033 A1 | 2/2006 | Nomura et al. |
| 2009/0267121 A1 | 10/2009 | Ishida et al. |
| 2014/0231804 A1 | 8/2014 | Yan et al. |

FOREIGN PATENT DOCUMENTS

| | | |
|---|---|---|
| JP | 2002-026372 A | 1/2002 |
| JP | 2004014695 A | 1/2004 |

OTHER PUBLICATIONS

First Chinese Office Action dated May 5, 2016; Appln. No. 201310110174.9.

International Preliminary Report on Patentability issued Sep. 29, 2015; PCT/CN2013/082185.

Second Chinese Office Action dated Dec. 19, 2016; Appln. No. 201310110174.9.

\* cited by examiner

AMORPHOUS SILICON PHOTOELECTRIC DEVICE AND FABRICATING METHOD THEREOF

FIELD

The present disclosure relates to an amorphous-silicon (a-Si) photoelectric device and a fabricating method thereof.

BACKGROUND

At present, an a-Si photoelectric device is mainly used in X-RAY DIFFRACTION (XRD) detection, such as in hospitals, airports, subways, etc., and particularly can be used for detection of specific hazardous materials and so on.

SUMMARY

The present disclosure provides an a-Si photoelectric device and a fabricating method thereof, which can simplify the fabricating method of an a-Si photoelectric device, thereby improving the fabrication efficiency and reducing costs.

According to one aspect of the present disclosure, there is provided a fabricating method of an a-Si photoelectric device, and the method comprises steps of: performing a first patterning process so that patterns of a gate-electrode layer, a photosensor with the photodiode structure and a contact layer located below the photosensor are formed on a substrate, wherein the contact layer is partially covered by the photosensor, and the contact layer and the gate-electrode layer are provided in a same layer and made of a same material; performing a second patterning process, so that patterns of an insulating layer, a semiconductor layer and a source/drain-electrode layer are sequentially formed on the resultant substrate of the first patterning process; and forming a first passivation layer on the resultant substrate of the second patterning process, and performing a third patterning process so that a first via-hole is formed in the first passivation layer to expose partial regions of the contact layer, the photosensor, and the source/drain-electrode layer.

According to an example, the method further comprises a step of performing a fourth patterning process so that an electrically-conductive layer is formed on the resultant substrate of the third patterning process. And the electrically-conductive layer covers the first via-hole and the region of the semiconductor layer located between the source electrode and the drain electrode, and connects the contact layer and a source electrode or a drain electrode in the source/drain-electrode layer.

According to an example, the method further comprises steps of: forming a second passivation layer on the resultant substrate of the fourth patterning process, and performing a fifth patterning process so that a second via-hole is formed in the second passivation layer to at least expose a partial region of a gate line; and performing a sixth patterning process so that a first transparent electrically-conductive layer is formed on the resultant substrate of the fifth patterning process to cover the second via-hole.

According to an example, the step of performing a first patterning process so that patterns of a gate-electrode layer, a photosensor with the photodiode structure and a contact layer located below the photosensor are formed on a substrate comprises steps of: forming the gate-electrode layer, a semiconductor layer, a transparent electrically-conductive layer and a photoresist on the substrate; and performing an exposure-and-development-process, an etching process and an ashing process on the resultant substrate of the previous step so that the gate-electrode layer, the gate-line contact layer and the photosensor are formed.

According to an example, the step of performing the exposure-and-development-process comprises steps of: performing a partial exposing process on a photoresist located above the gate-electrode layer, the gate line and a region of the contact layer which is not covered by the photosensor, so as to form a partially-exposed region; performing no exposing process on a photoresist located above the photosensor, so as to form a non-exposed region; and performing full exposing process on a photoresist located in other regions so as to form a fully-exposed region.

According to an example, the steps of performing the etching process and an ashing process comprises the steps of: performing an etching process on a second transparent electrically-conductive layer in the photosensor with the photodiode structure so as to etch off the second transparent electrically-conductive layer in the fully-exposed region; performing an etching process on the semiconductor layer in the photosensor with the photodiode structure so as to etch off the semiconductor layer in the photosensor with the photodiode structure in the fully-exposed region; performing an etching process on the gate-electrode layer so as to etch off the gate-electrode layer in the fully-exposed region; removing the photoresist in the partially-exposed region in an ashing process; performing an etching process on the second transparent electrically-conductive layer in the photosensor with the photodiode structure so as to etch off the second transparent electrically-conductive layer in the partially-exposed region; performing an etching process on the semiconductor layer in the photosensor with the photodiode structure so as to etch off the semiconductor layer in the photosensor with the photodiode structure in the partially-exposed region; and stripping off the residual photoresist on the substrate completely.

According to another aspect of the present disclosure, there is provided an a-Si photoelectric device comprising: a substrate; a thin-film transistor and a photosensor with the photodiode structure provided at different positions on the substrate; and a contact layer located below the photosensor and partially covered by the photosensor, wherein the contact layer and the gate-electrode layer in the thin-film transistor are provided in a same layer and made of a same material.

According to an example, the a-Si photoelectric device further comprises: a first passivation layer covering over the photosensor and the thin-film transistor, a first via-hole provided in the first passivation layer to expose partial regions of the contact layer, the photosensor, and a source/drain-electrode layer in the thin-film transistor, and an electrically-conductive layer provided above the first passivation layer so as to cover the first via-hole and the region of the semiconductor layer located between a source electrode and a drain electrode in the thin-film transistor, and connect the contact layer and the source electrode or drain electrode in the thin-film transistor.

According to the technical solutions of the present disclosure, the fabricating procedure of an a-Si photoelectric device can be simplified, thereby improving the fabrication efficiency and reducing costs.

BRIEF DESCRIPTION OF THE DRAWINGS

In order to clearly illustrate the technical solutions in the present disclosure or the prior art, the drawings needed for the description of the technical solutions of the present disclosure or the prior art will be briefly described in the following. It is obvious that the described drawings are merely illustration of some specific embodiments of the technical solutions of the present disclosure. Based on these accompanying drawings, those skilled in the art can obtain other drawing(s), without any inventive work.

DETAILED DESCRIPTION OF THE PREFERRED EMBODIMENTS

Hereinafter, the technical solutions in the embodiments of the present disclosure will be described in a clearly and fully understandable way, in connection with the accompanying drawings in the embodiments of the present disclosure. It is obvious that, the described embodiments are only a part but not all of the embodiments of the present disclosure. Based on the embodiments in the present disclosure, those ordinary skilled in the art can obtain all other embodiment(s), without any inventive work, which should be within the scope of the present disclosure.

Unless otherwise defined, technical jargon or scientific terms used herein should be interpreted in the usual sense as understood by those ordinary skilled in the relevant art of the present disclosure. The terms "first", "second", and the like, used in the specification and claims of this patent application of the disclosure, do not denote any order, quantity, or importance, but are used to distinguish among different integral parts. Likewise, the words "a", "an" and the like, herein do not denote a limitation of quantity, but denote the presence of at least one of the referenced item. The terms "connection" or "interconnection" or the like, are not limited to physical or mechanical connections, but may comprise electrical connection, whether direct or indirect. The terms "upper", "lower", "left", "right" and the like, are only used to indicate a relative positional relationship, which may be varied with a change of an absolute position of a described object.

Figure 1A:
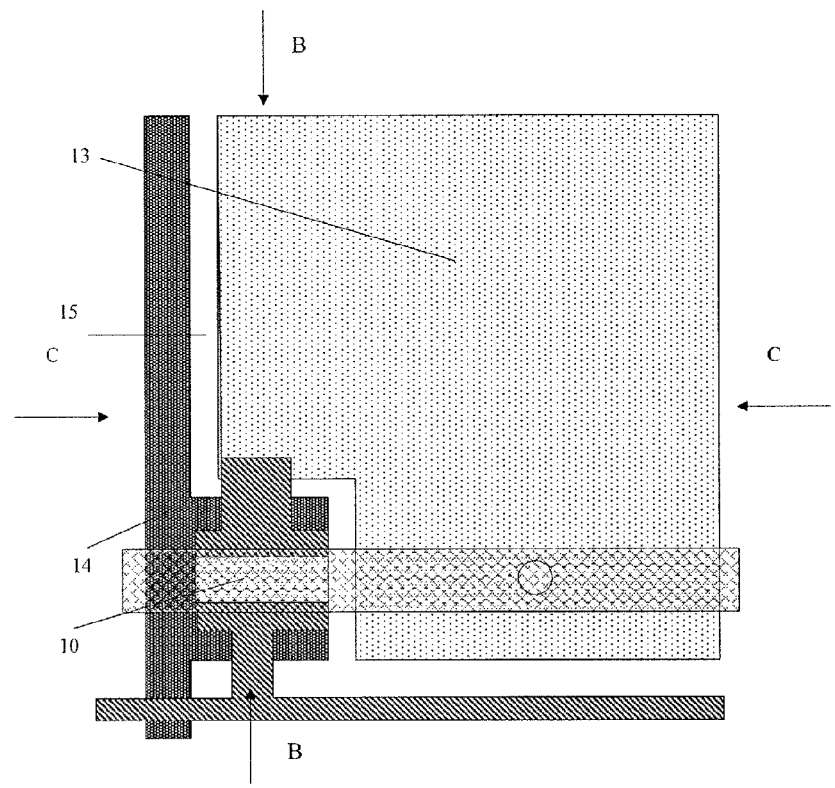
FIG. 1A and FIG. 1B are a schematic plan view and a schematic sectional view taken along the line B-B in FIG. 1A, respectively, showing an a-Si photoelectric device.
Figure 1B:
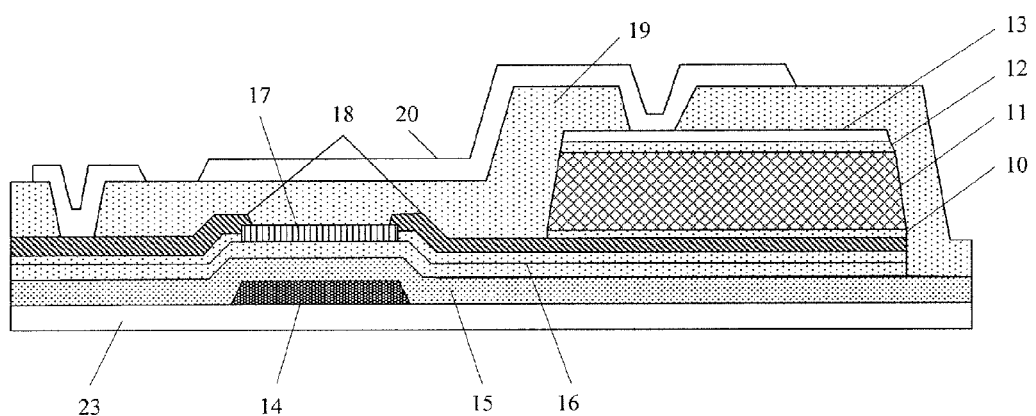

FIG. 1A and FIG. 1B are a schematic plan view and a schematic sectional view taken along the line B-B in FIG. 1A, respectively, showing an a-Si photoelectric device. As shown in FIG. 1B, the a-Si photoelectric device formed on a glass substrate 23 mainly consists of two parts. One part is a photosensor with photodiode-structure, and the photosensor with the photodiode structure comprises an n type amorphous silicon ($n^+$a-Si) layer 10, an a-Si layer 11, a p-type amorphous silicon ($p^+$a-Si) layer 12 and an electrically-conductive layer 13. The photosensor with photodiode structure is mainly used to receive light and generate electric current due to a photovoltaic effect. The other part is a thin-film transistor comprising a gate-electrode layer 14, a semiconductor layer comprising a first insulating layer 15 and an a-Si layer 16, a barrier layer 17, a source/drain-electrode layer 18, a protective layer 19 and a transparent electrically-conductive layer 20. The thin-film transistor is mainly used as a switch and transmits the electric-current signals generated by the photosensor.

Figure 7:
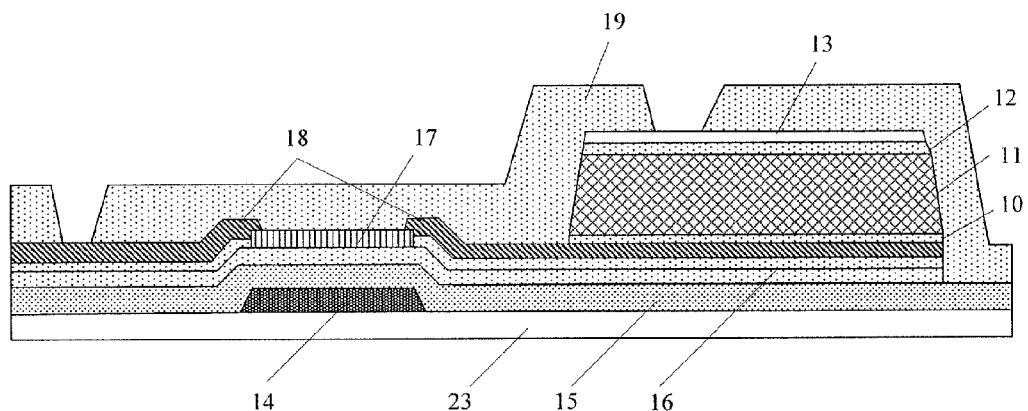
Figure 8:
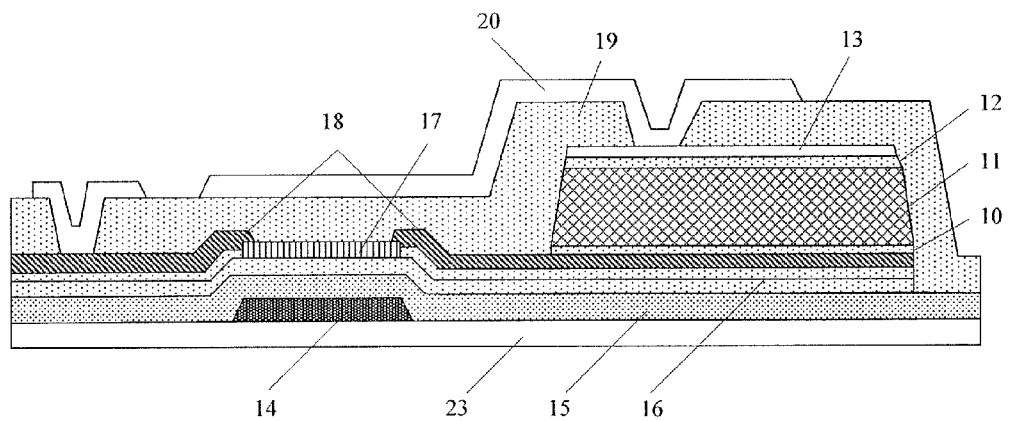
Figure 9:
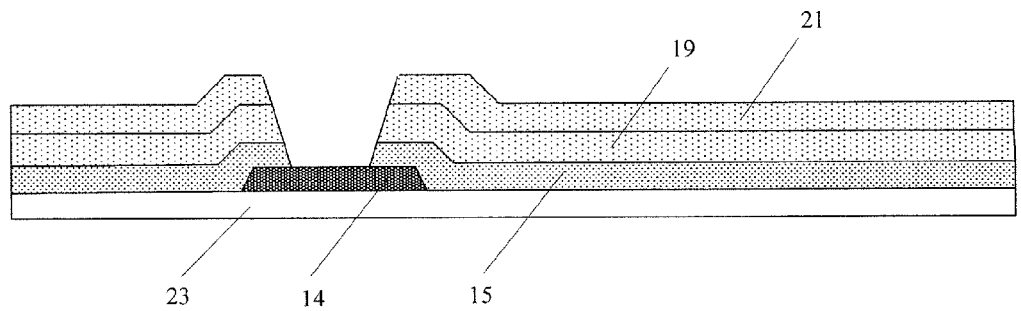
Figure 10:
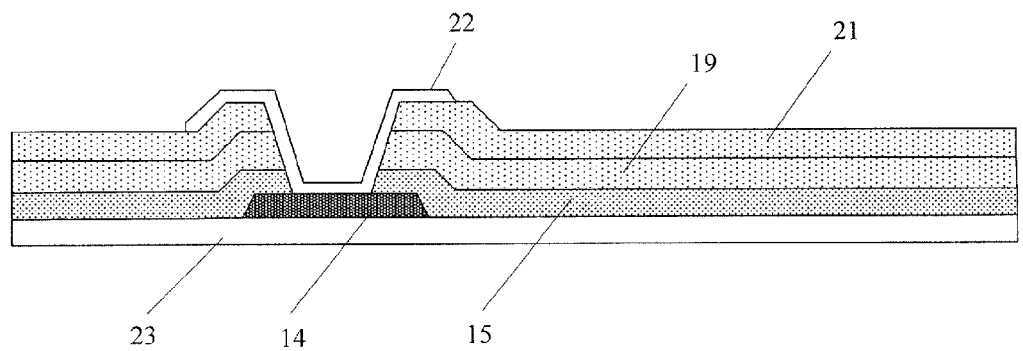

Referring to FIGS. 2-10, a fabricating method of an a-Si photoelectric device as shown in FIGS. 1A and 1B will be described as following. FIGS. 2-8 are sectional views taken along the line B-B in FIG. 1A, while FIGS. 9 and 10 are sectional views taken along the line C-C in FIG. 1A.

Figure 2:
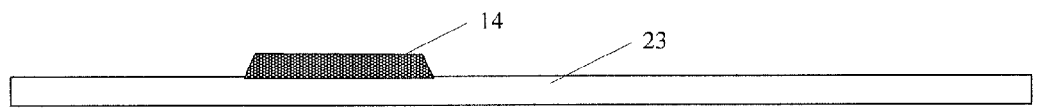
FIGS. 2-10 are schematic sectional views, showing structures obtained at various stages during fabricating processes of an a-Si photoelectric device.

As shown in FIG. 2, in a first masking process, a gate-electrode layer 14 is formed on a glass substrate 23.

Figure 3:
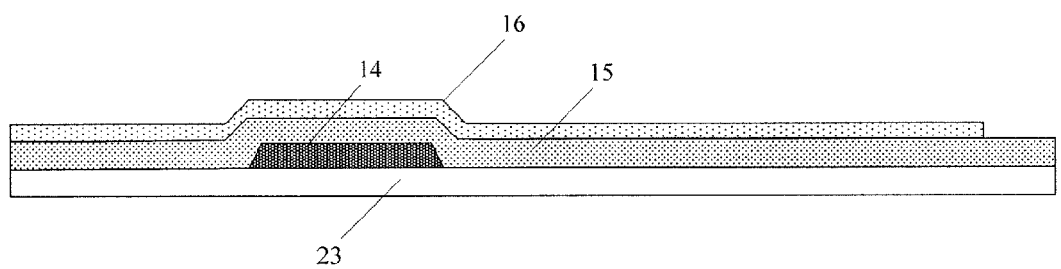

As shown in FIG. 3, in a second masking process, a semiconductor layer is formed on the gate-electrode layer 14 and the glass substrate 23, and the semiconductor layer comprises a first insulating layer 15 and an a-Si layer 16; the first insulating layer 15 is located above the gate-electrode layer 14, and the a-Si layer 16 is located above the first insulating layer 15.

Figure 4:
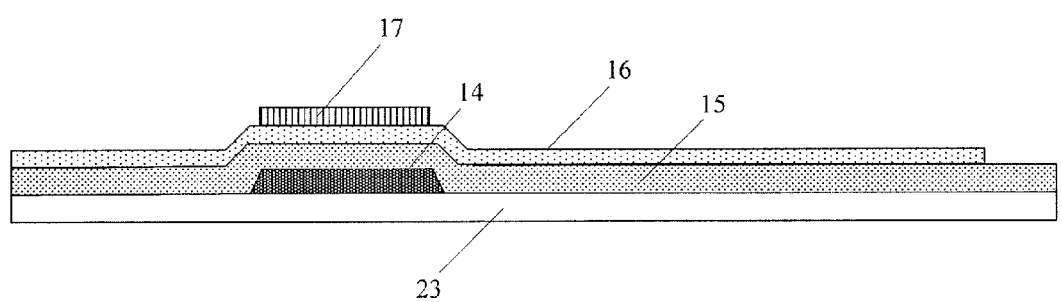

As shown in FIG. 4, in a third masking process, a barrier layer 17 is formed on the semiconductor layer.

Figure 5:
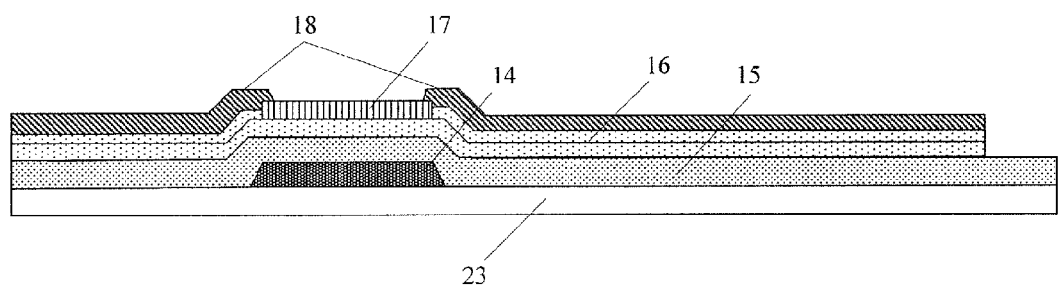

As shown in FIG. 5, in a fourth masking process, a source/drain-electrode layer 18 is formed on the barrier layer 17 and the semiconductor layer.

Figure 6:
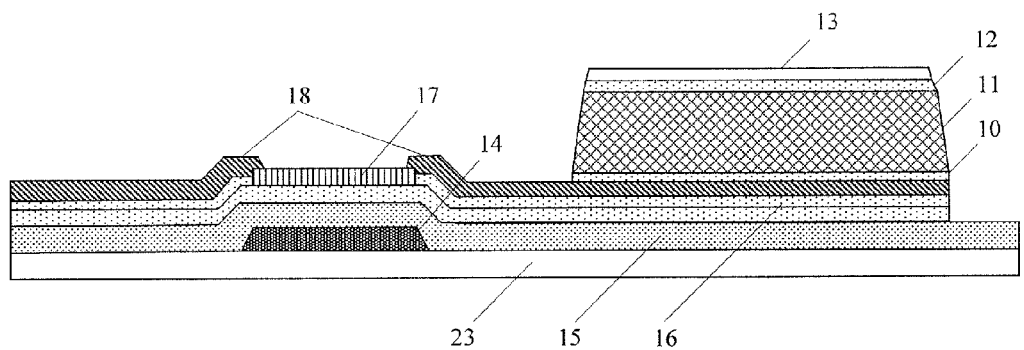

As shown in FIG. 6, in a fifth masking process, a photosensor with the photodiode structure is formed on the source/drain-electrode layer 18, and the photosensor comprises: an n⁺a-Si layer 10, an a-Si layer 11, a p⁺a-Si layer 12 and an electrically-conductive layer 13.

As shown in FIG. 7, a first passivation layer 19 is deposited on the above-described structure, and then in a sixth masking process, via-holes are formed in the first passivation layer 19 above the electrically-conductive layer 13 of the photosensor and the source/drain-electrode layer 18 of the thin-film transistor, respectively.

As shown in FIG. 8, in a seventh masking process, an electrically-conductive layer 20 is formed on the first passivation layer 19.

As shown in FIG. 9, in an eighth masking process, for a region as part of gate lines of the gate-electrode layer 14, a via-hole reaching the gate-electrode layer 14 is formed in a second passivation layer 21.

As shown in FIG. 10, then in a ninth masking process, a transparent electrically-conductive layer 22 is formed above the via-hole of the second passivation layer 21.

As described above, according to the above processes, nine masking processes are required to complete the entire fabrication of an a-Si photoelectric device, and therefore the fabrication process is very complex, high-cost and low efficient.

According to the present disclosure, a first patterning process is performed, so that patterns of a gate-electrode layer, a photosensor with the photodiode structure and a contact layer located below the photosensor are formed, the contact layer is partially covered by the photosensor, and the contact layer and the gate-electrode layer are provided in a same layer and made of a same material. A second patterning process is performed so that patterns of an insulating layer, a semiconductor layer and a source/drain-electrode layer are sequentially formed on the resultant structure of the first patterning process. And a first passivation layer is formed on the resultant structure of the second patterning process. A third patterning process is performed, so that a first via-hole is formed in the first passivation layer to expose partial regions of the contact layer, the photosensor, and the source/drain-electrode layer.

Hereinafter, the present disclosure is explained in detail with the accompanying drawings and embodiments.

The patterning processes described herein may specifically be masking processes, and the substrate may specifically be a glass substrate, and the semiconductor layer may specifically comprise an a-Si layer, a n⁺a-Si layer, and/or a P⁺a-Si layer. The transparent electrically-conductive layer may specifically be an ITO (indium-tin oxide) layer.

Figure 11:
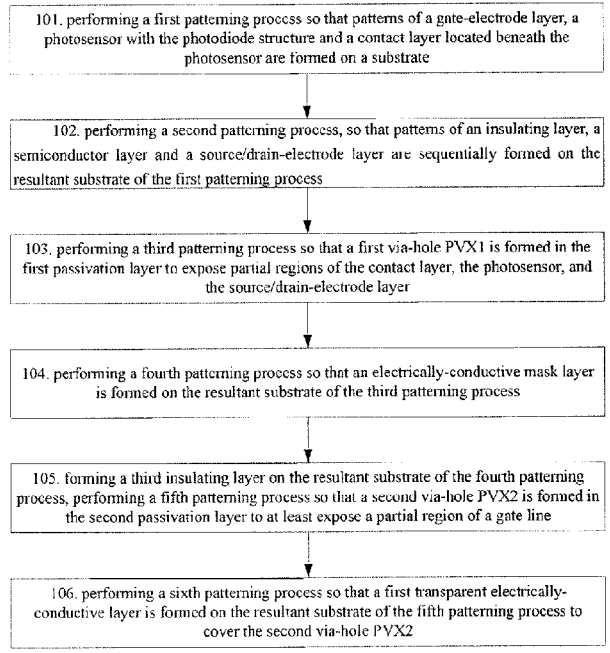
FIG. 11 is a schematic flow chart of a fabricating method of an a-Si photoelectric device according to the present disclosure.

The present disclosure provides a fabricating method of an a-Si photoelectric device, and FIG. 11 is a schematic flowchart of the fabricating method of an a-Si photoelectric device according to the present disclosure. As shown in FIG. 11, the method comprises following steps.

Step 101, a first masking process is performed, so that on a substrate, patterns of a gate electrode and a gate line in a thin-film transistor, a photosensor with the photodiode structure and a contact layer located below the photosensor are formed.

Here, the contact layer is partially covered by the photosensor, and the contact layer and the gate-electrode layer are provided in a same layer and made of a same material Here, the step of performing a first patterning process so that patterns of a gate-electrode layer, a photosensor with the photodiode structure and a contact layer located below the photosensor are formed on a substrate comprises following steps of: forming the gate-electrode layer, a semiconductor layer, a transparent electrically-conductive layer and a photoresist on the substrate; and performing an exposure-and-development-process, an etching process and an ashing process on the resultant substrate of the previous step so that the gate-electrode layer, the gate-line contact layer and the photosensor are formed.

Here, the step of performing the exposure-and-development-process can specifically comprises following steps of: by using a halftone mask, performing a partial exposing process on a photoresist located above the gate-electrode layer, the gate line and a region of the contact layer which is not covered by the photosensor, so as to form a partially-exposed region, performing no exposing process on a photoresist located above the photosensor, so as to form a non-exposed region, and performing full exposing process on a photoresist located in other regions so as to form a fully-exposed region.

Here, the steps of performing the etching process and an ashing process comprises the steps of: performing an etching process on a second transparent electrically-conductive layer in the photosensor with the photodiode structure so as to etch off the second transparent electrically-conductive layer in the fully-exposed region; performing an etching process on the semiconductor layer in the photosensor with the photodiode structure so as to etch off the semiconductor layer in the photosensor with the photodiode structure in the fully-exposed region; performing an etching process on the gate-electrode layer so as to etch off the gate-electrode layer in the fully-exposed region; removing the photoresist in the partially-exposed region in an ashing process; performing an etching process on the second transparent electrically-conductive layer in the photosensor with the photodiode structure so as to etch off the second transparent electrically-conductive layer in the partially-exposed region; performing an etching process on the semiconductor layer in the photosensor with the photodiode structure so as to etch off the semiconductor layer in the photosensor with the photodiode structure in the partially-exposed region; and stripping off the residual photoresist on the substrate completely.

For example, firstly a gate-electrode layer 14' is deposited on a glass substrate 23 by a magnetron-sputtering method, and then an n⁺a-Si layer 10', an a-Si layer 11', a p⁺a-Si layer 12' and an electrically-conductive layer 13' are sequentially deposited by a plasma enhanced chemical vapor deposition (PECVD) method. The material of the gate-electrode layer 14' may be a single layer of aluminum-neodymium (AlNd) alloy, aluminum (Al), copper (Cu), molybdenum (Mo), molybdenum-tungsten (MoW) alloy, or chromium (Cr), and also may be a composite film composed of any combination of aluminum-neodymium (AlNd) alloy, aluminum (Al), copper (Cu), molybdenum (Mo), molybdenum-tungsten (MoW) alloy, and chromium (Cr). The electrically-conductive layer 13' is a transparent electrically-conductive thin film, which may be formed of a material such as ITO, IZO, etc, for example. Then, by using a coating machine, a layer of photoresist 24 is applied on the deposited electrically-conductive layer 13'.

Figure 12A:
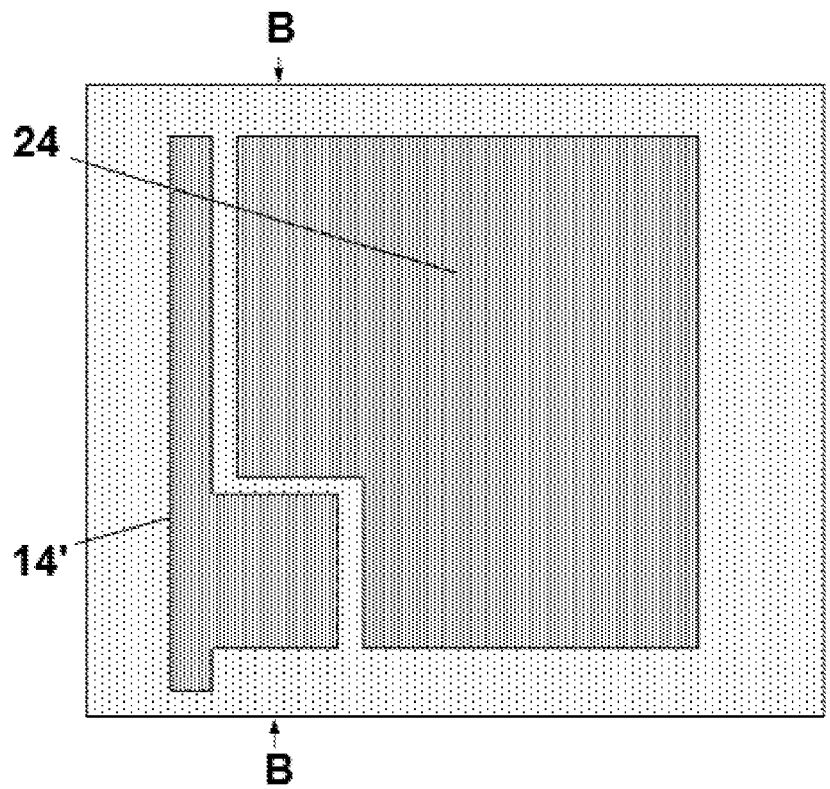
FIG. 12A and FIG. 12B are a schematic plan view and a schematic sectional view taken along the line B-B in FIG. 12A, respectively, showing a structure obtained after mask exposure-and-development-process during a first masking process of the present disclosure.
Figure 12B:
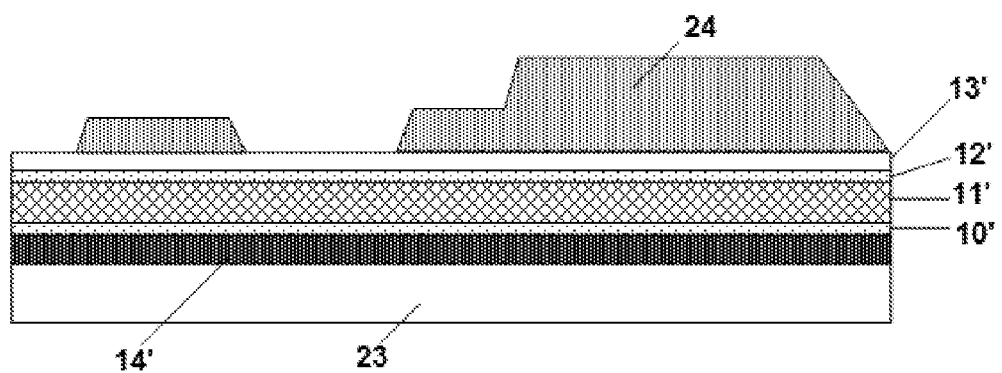

Then an exposure-and-development-process by using a mask is performed on the above resultant structure. FIG. 12A and FIG. 12B are a schematic plan view and a schematic sectional view taken along the line B-B in FIG. 12A, respectively, showing a structure obtained after the exposure-and-development-process during the first masking process. As shown in FIG. 12B, by using a half-tone mask, the photoresist 24 is formed. A partially-exposed region of the photoresist 24 is formed in a via-hole region which connects between the gate-electrode layer 14' as shown in FIG. 1 and the structure of the photosensor with the photodiode structure to be formed; a non-exposed region of the photoresist 24 is formed in the region of the photosensor with the photodiode structure; a fully-exposed region of the photoresist 24 is formed in other regions on the substrate 23.

Figure 13A:
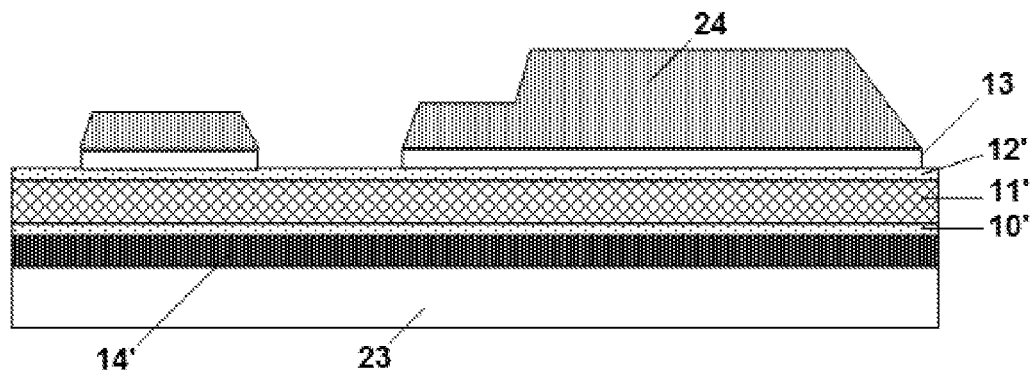
FIGS. 13A-13F are schematic sectional views of structures obtained at various stages of etching process after mask exposure-and-development-process during the first masking process of the present disclosure.
Figure 13B:
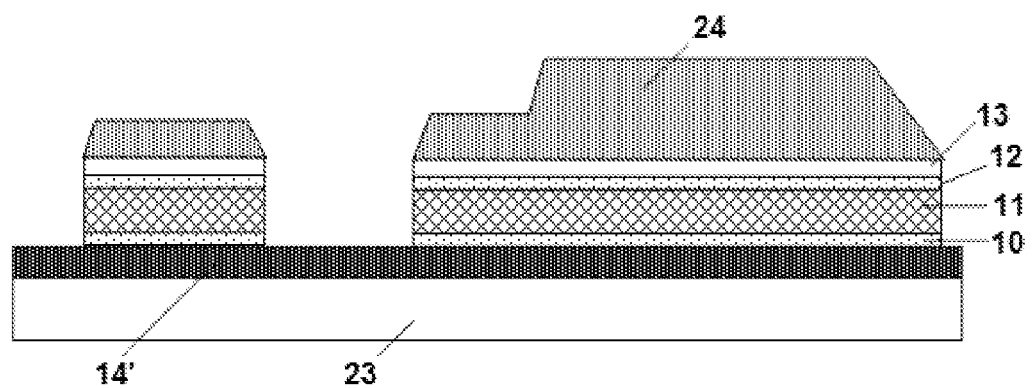
Figure 13C:
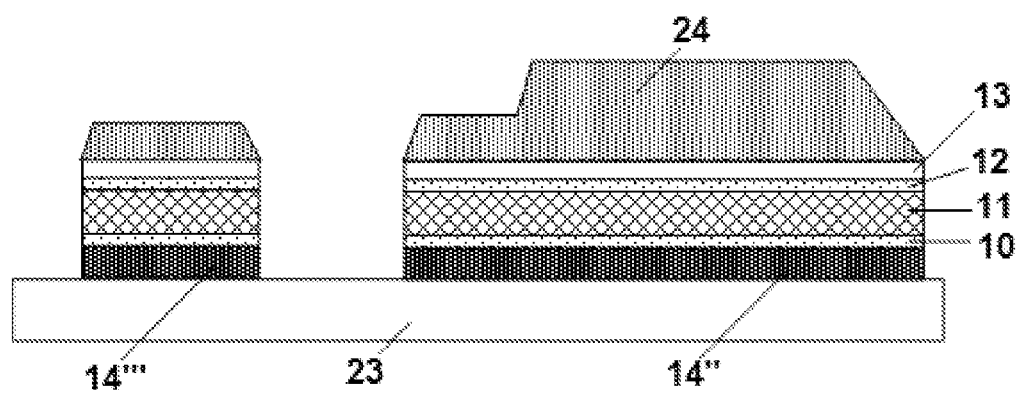
Figure 13D:
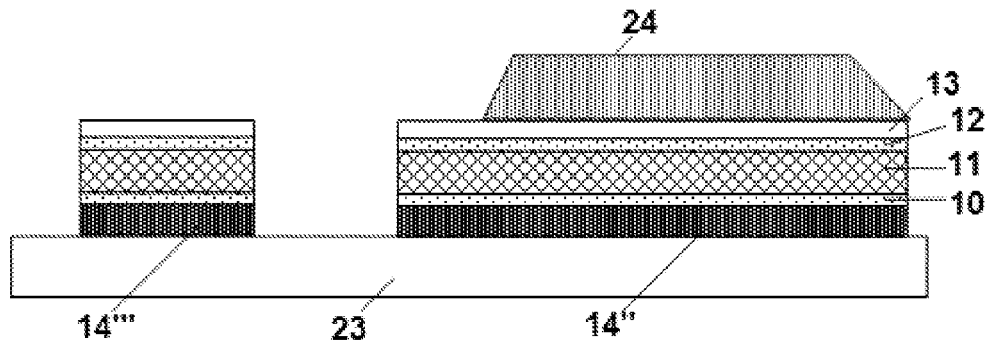
Figure 13E:
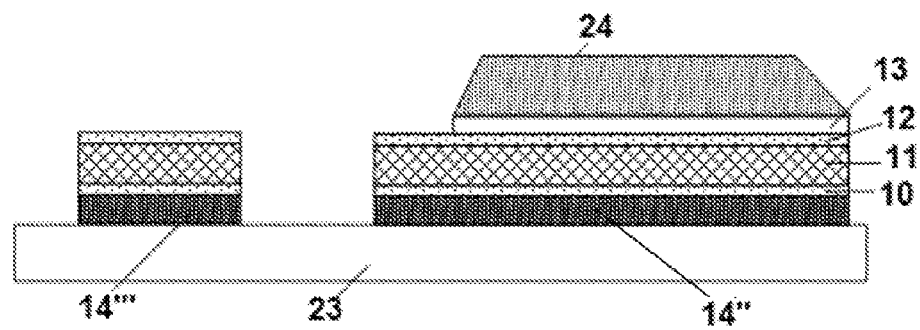
Figure 13F:
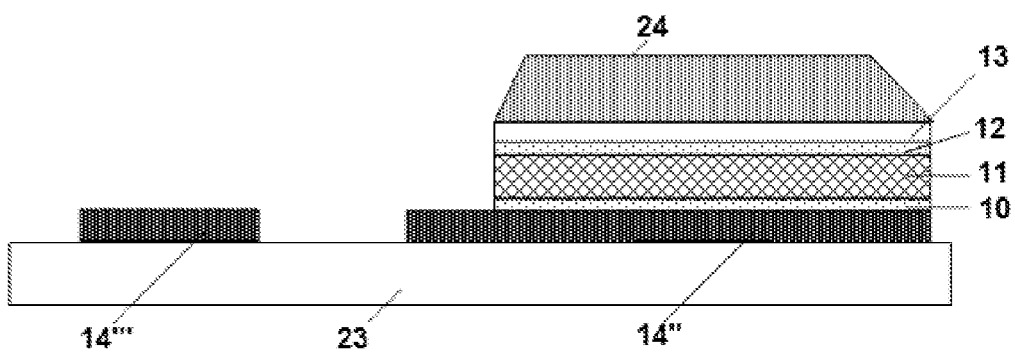
Figure 14A:
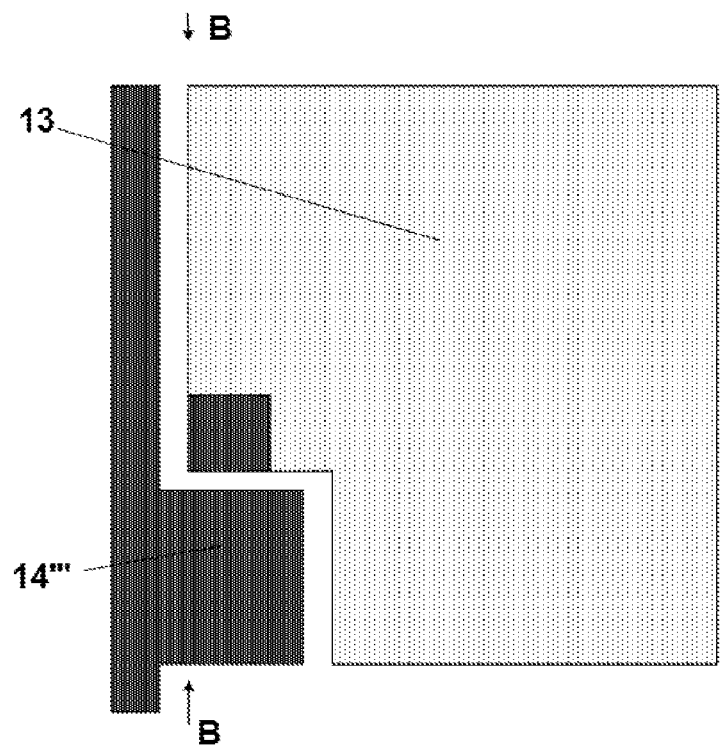
FIG. 14A and FIG. 14B are a schematic plan view and a schematic sectional view taken along the line B-B in FIG. 14A, respectively, showing a structure obtained after photoresist-stripping during the first masking process of the present disclosure.
Figure 14B:
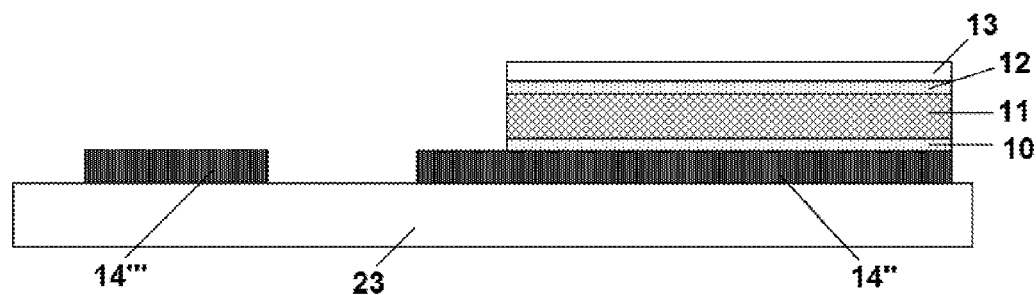

The structure shown in FIG. 12A and FIG. 12B after the exposure-and-development-process is subjected to following processes. At first, the electrically-conductive layer 13' in the photosensor with the photodiode structure is subjected to an etching process, and typically, a wet etching method is used for etching the electrically-conductive layer 13', so that the electrically-conductive layer 13' in the fully-exposed region is etched off, thereby obtaining the structure shown in FIG. 13A. Next, the semiconductor layer in the photosensor with the photodiode structure of the structure shown in FIG. 13A is subjected to an etching process, and here, a dry etching method is used for etching the n$^+$a-Si layer 10', the a-Si layer 11' and the p$^+$a-Si layer 12', so that the semiconductor layer in the photosensor with the photodiode structure in the fully-exposed region is etched off, thereby obtaining the structure shown in FIG. 13B. And next, the gate-electrode layer 14' of the structure shown in FIG. 13B is subjected to an etching process, and here, a wet etching method is used for etching the gate-electrode layer 14, so that the gate-electrode layer 14' in the fully-exposed region is etched off, thereby obtaining the structure shown in FIG. 13C, that is, forming the gate electrode 14''' and the contact layer 14''. Then, the photoresist 24 in the partially-exposed region of the structure shown in FIG. 13C is removed by an ashing process, thereby obtaining the structure shown in FIG. 13D. And then, the electrically-conductive layer 13 in the photosensor with the photodiode structure is again subjected to an etching process, and typically, a wet etching method is used for etching the electrically-conductive layer 13, so that the electrically-conductive layer 13 in the partially-exposed region is etched off, thereby obtaining the structure shown in FIG. 13E. And then, the semiconductor layer in the photosensor with the photodiode structure of the structure shown in FIG. 13E is subjected to an etching process, and here, a dry etching is used for etching the n$^+$a-Si layer 10, the a-Si layer 11, and the p$^+$a-Si layer 12, so that the semiconductor layer in the photosensor with the photodiode structure in the partially-exposed region is etched off, thereby obtaining the structure shown in FIG. 13F. Finally, the structure shown in FIG. 13F is subjected to a stripping process, so that the residual photoresist 24 is completely removed, thereby obtaining the structure as shown in FIG. 14A and FIG. 14B. FIG. 14A is a schematic plan view, and FIG. 14B is a schematic sectional view taken along the line B-B in FIG. 14A.

Figure 15A:
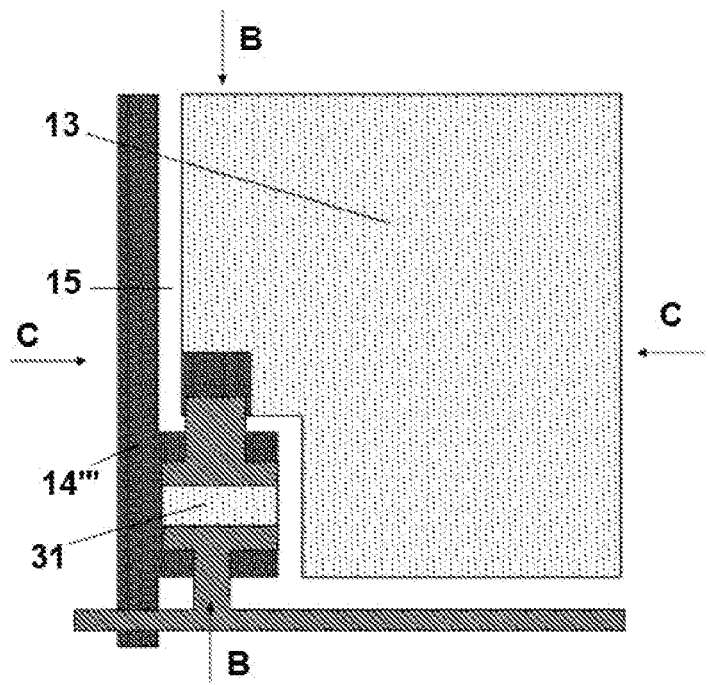
FIG. 15A is a schematic plan view, showing a structure obtained after a second masking process of the present disclosure.
Figure 15B:
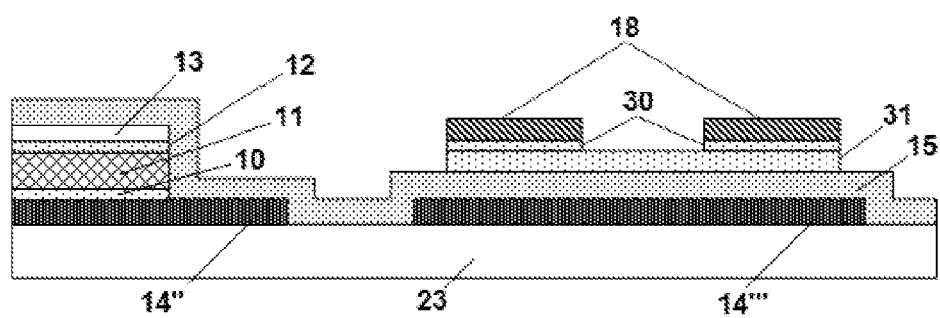
FIG. 15B and FIG. 15C are schematic sectional views taken along the line B-B and the line C-C in FIG. 15A, respectively, showing a structure obtained after the second masking process of the present disclosure.
Figure 15C:
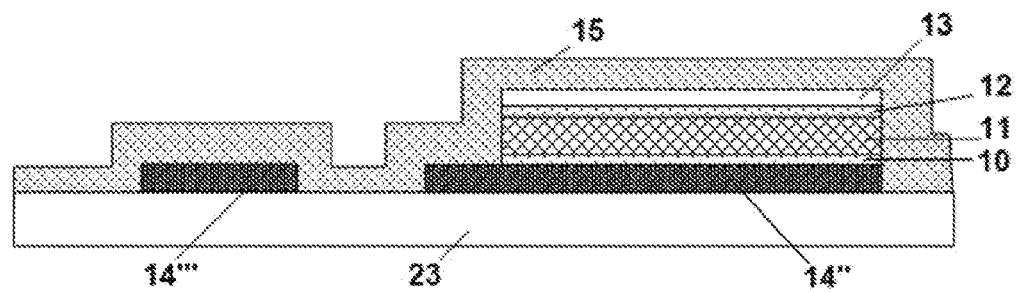

Step 102, a second masking process is performed. Specifically, on the resultant structure of Step 101, next a second masking process is performed. On the structure shown in FIG. 14A and FIG. 14B, an insulating layer 15, an a-Si layer 31 and an n$^+$a-Si layer 30 are sequentially deposited by an enhanced chemical vapor deposition method, and a source/drain-electrode layer 18 is deposited by a magnetron-sputtering method. Then a photoresist is coated on the above resultant structure. And after an exposure-and-development-process, the photoresist for a source/drain-electrode pattern is formed, and a source/drain-electrode pattern is formed by a wet etching process. And then the n$^+$a-Si layer 30 in a channel of the thin-film transistor is etched by a dry etching process. And after stripping off the photoresist, the structure comprising the insulating layer 15, the a-Si layer 31, the n$^+$a-Si layer 30 and the source/drain-electrode layer 18 as shown in FIGS. 15A-15C is obtained finally. FIG. 15A is a plan view, while FIG. 15B and FIG. 15C are schematic sectional views taken along the line B-B and the line C-C in FIG. 15A, respectively.

Figure 16A:
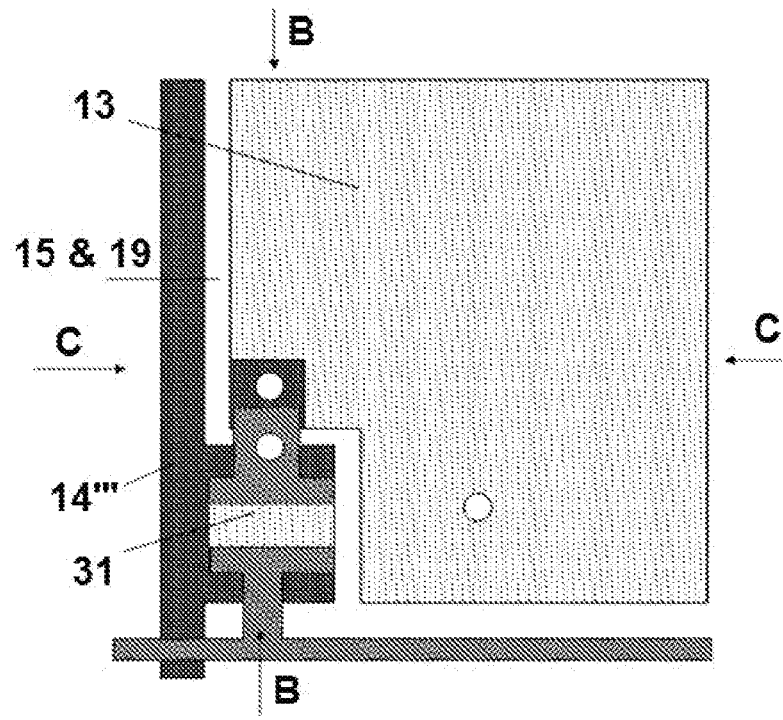
FIG. 16A is a schematic plan view, showing a structure obtained after a third masking process of the present disclosure.
Figure 16B:
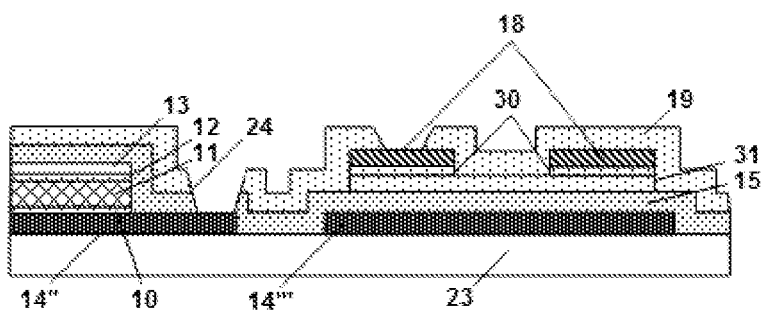
FIG. 16B and FIG. 16C are schematic sectional views taken along the line B-B and the line C-C in FIG. 16A, respectively, showing a structure obtained after the third masking process of the present disclosure.
Figure 16C:
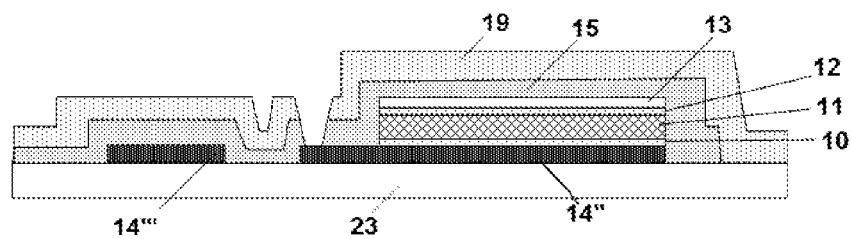

Step 103, a third masking process is performed, so that a via-hole is formed in the passivation layer to expose partial regions of the contact layer, the photosensor, and the source/drain-electrode layer. For example, on the resultant structure of Step 102, a first passivation layer 19 is deposited by a plasma enhanced chemical vapor deposition method. Next the third masking process is performed, that is, a photoresist is coated on the via-hole region connecting the source and the photosensor with the photodiode structure, and after exposure-and-development-process, the photoresist for the pattern of a via-hole in the first passivation layer is formed. And then a first via-hole 24 is formed in the first passivation layer 19 by a dry etching method. After stripping off the photoresist, the structure as shown in FIGS. 16A-16C is obtained. FIG. 16A is a plan view, while FIG. 16B and FIG. 16C are schematic sectional views taken along the line B-B and the line C-C in FIG. 16A, respectively.

Figure 17A:
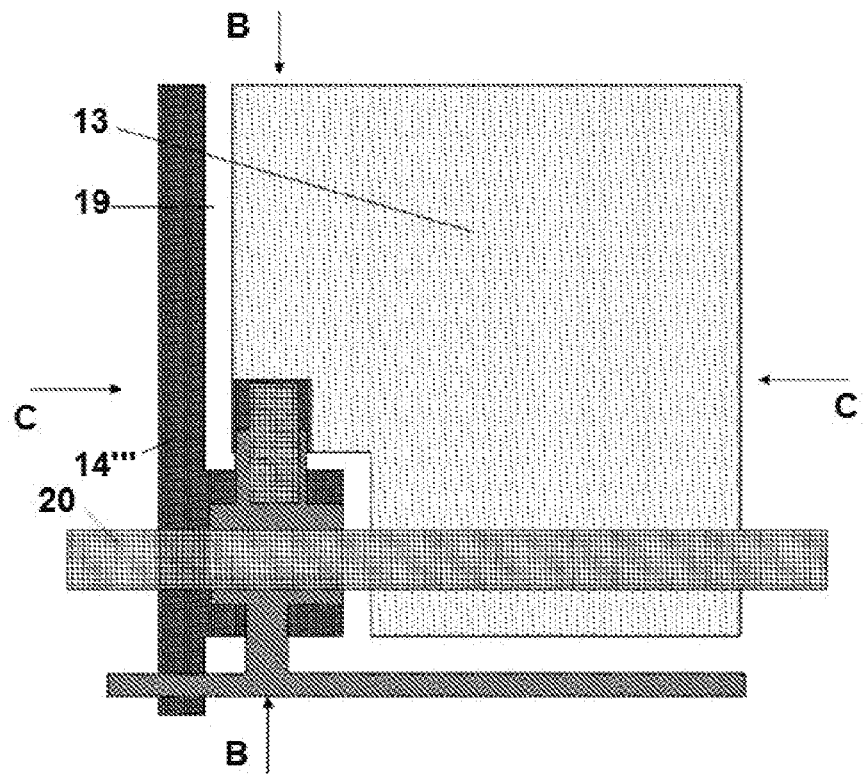
FIG. 17A is a schematic plan view, showing a structure obtained after a fourth masking process of the present disclosure.
Figure 17B:
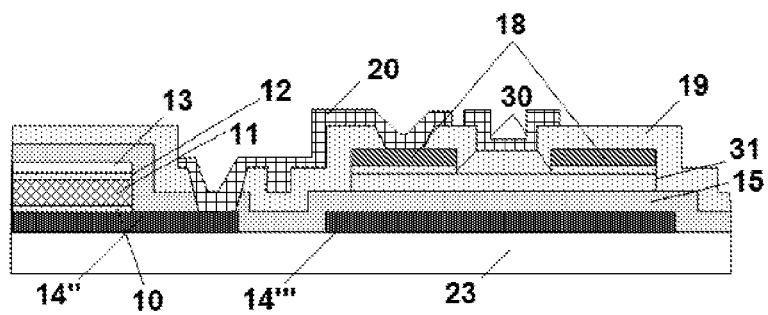
FIG. 17B and FIG. 17C are schematic sectional views taken along the line B-B and the line C-C in FIG. 17A, respectively, showing a structure obtained after the fourth masking process of the present disclosure.
Figure 17C:
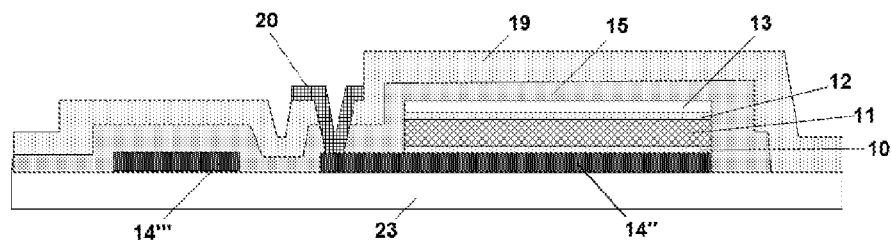

Step 104, a fourth masking process is performed, so that on the resultant structure of the third masking process, an electrically-conductive layer is formed. For example, on the resultant structure of Step 103, a fourth masking process is performed. Here, a metal thin-film layer is deposited by a magnetron-sputtering method, then a photoresist is applied on the structure deposited with the metal thin-film layer, and after exposure-and-development-process, the photoresist for a pattern of an electrically-conductive layer is formed. Then an electrically-conductive layer 20 is formed on the resultant structure by a wet etching method, and the photoresist is removed by a stripping method, thereby obtaining the structure as shown in FIGS. 17A-17C. FIG. 17A is a plan view, while FIG. 17B and FIG. 17C are schematic sectional views taken along the line B-B and the line C-C in FIG. 17A, respectively.

Figure 18A:
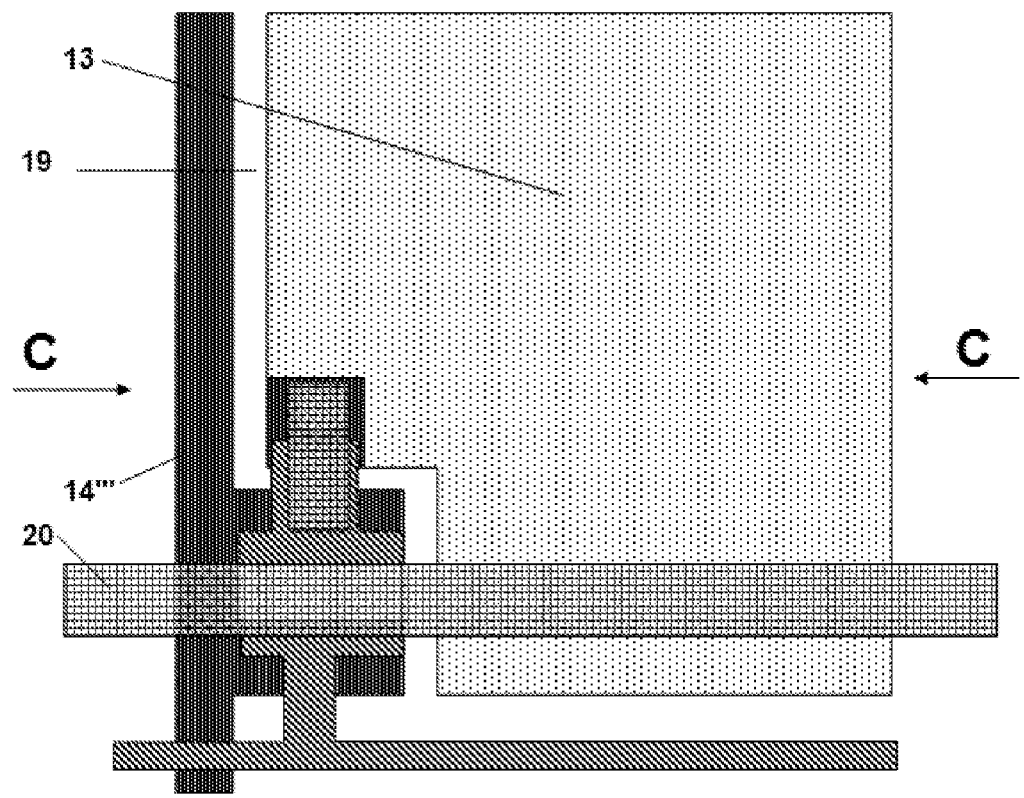
FIG. 18A is a schematic plan view, showing a structure obtained after a fifth masking process of the present disclosure.
Figure 18B:
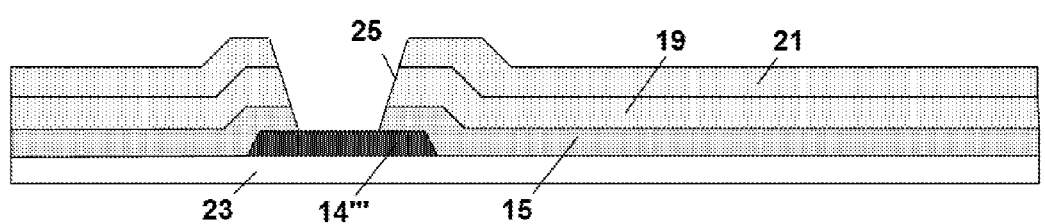
FIG. 18B is a schematic sectional view taken along the line C-C in FIG. 18A, showing a structure obtained after the fifth masking process of the present disclosure.

Step 105, on the resultant structure of the fourth masking process, a second passivation layer is formed, and next a fifth masking process is performed, so that a via-hole in the passivation layer is formed to at least expose a partial region of a gate line. For example, on the resultant structure of Step 104, a second passivation layer 21 is deposited by a plasma enhanced chemical vapor deposition method. Next the fifth masking process is performed, that is, a photoresist is applied on a peripheral signal-wiring regions of the resultant structure, and after an exposure-and-development-process and a dry etching process, a second via-hole 25 is formed in the second passivation layer 21, and after stripping off the photoresist, the structure as shown in FIG. 18A and FIG. 18C is obtained.

Figure 19:
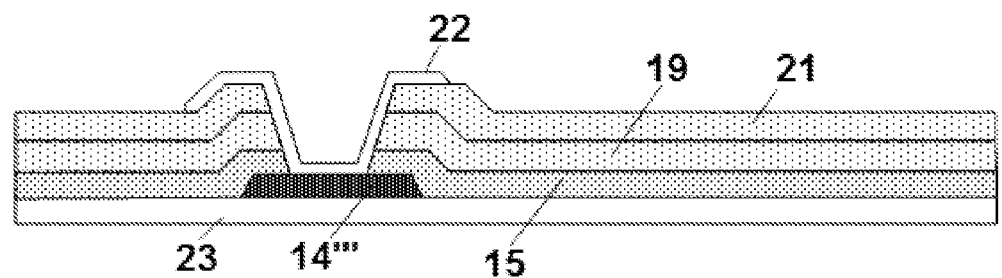
FIG. 19 is a schematic sectional view, showing a structure obtained after a sixth masking process of the present disclosure.

Step 106, a sixth masking process is performed, so that, on the resultant structure of the fifth masking process, a transparent electrically-conductive layer 22 is formed to cover the second via-hole 25 in the second passivation layer 21. For example, on the resultant structure of Step 105, by a magnetron-sputtering method, a transparent electrically-conductive thin film such as composed of ITO is deposited, and the sixth masking process is successively performed, so that the structure as shown in FIG. 19 is obtained; in this way, a transparent electrically-conductive layer 22 such as composed of ITO is formed on the second via-hole 25 of the second passivation layer 21.

Figure 20:
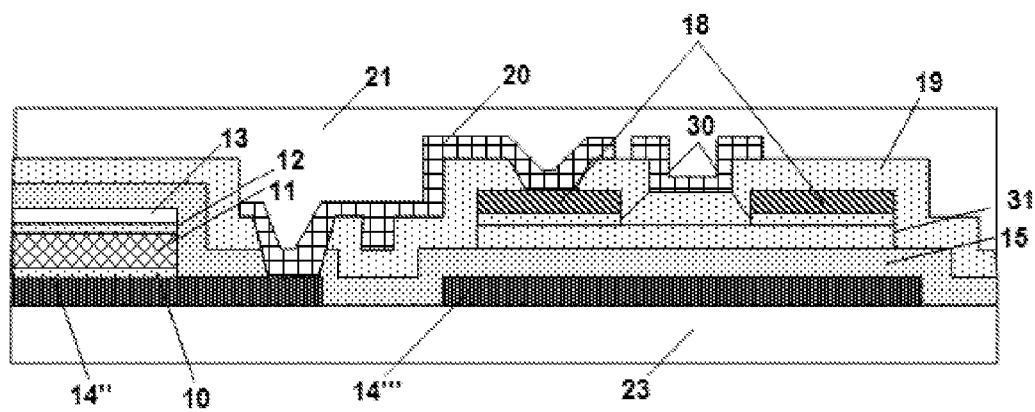
FIG. 20 is a schematic sectional view, showing an a-Si photoelectric device of the present disclosure.

The present disclosure further provides an a-Si photoelectric device comprising a substrate; a thin-film transistor and a photosensor with the photodiode structure provided at different positions on the substrate; and a contact layer located below the photosensor and partially covered by the photosensor. The contact layer and the gate-electrode layer in the thin-film transistor are provided in a same layer and made of a same material. For example, as shown in FIG. 20, the a-Si photoelectric device comprises: a substrate 23; and, a thin-film transistor comprising a gate electrode 14''', and a photosensor comprising an n⁺a-Si layer 10, an a-Si layer 11 and a p⁺a-Si layer 12, which are both provided on the substrate 23. A contact layer 14'' is provided below the photosensor and partially covered by the photosensor; moreover, the contact layer 14'' and the gate electrode 14 of the thin-film transistor are provided in a same layer and made of a same material.

Here, the photosensor and the thin-film transistor is covered by a first passivation layer 19, and in the first passivation layer 19, a via-hole is provided to expose a partial region of the contact layer. Here, an electrically-conductive layer 20 is provided above the first passivation layer 19, and the electrically-conductive layer 20 covers the via-hole, and connects the contact layer 14'' and the source electrode or the drain electrode in the thin-film transistor.

The above implementations are merely used to explain the present disclosure, but not for limiting the present disclosure. A variety of variations and modifications can be made by the ordinary skilled in the related art, without departing from the spirit and scope of the present disclosure; therefore, all equivalent technical solutions should also belong to the present disclosure, and the scope of the present disclosure should be defined by the claims.

What is claimed is:

1. A fabricating method of an amorphous-silicon photoelectric device, comprising steps of:
    performing a first patterning process so that patterns of a gate-electrode layer, a photosensor with a photodiode structure and a contact layer located below the photosensor are formed on a substrate, the photosensor being completely located above the contact layer, the contact layer being partially covered by the photosensor, the patterns of the gate-electrode layer including a gate-electrode, the contact layer and the gate-electrode being provided in a same layer and made of a same material;
    performing a second patterning process, so that an insulating layer, a second semiconductor layer, and patterns of a source/drain-electrode layer are sequentially formed on a resultant substrate of the first patterning process; and
    forming a first passivation layer on a resultant substrate of the second patterning process, and performing a third patterning process so that a first via-hole is formed in the first passivation layer to expose partial regions of the contact layer, the photosensor, and the source/drain-electrode layer.

2. The method according to claim 1, further comprising steps of:
    performing a fourth patterning process so that an electrically-conductive layer is formed on a resultant substrate of the third patterning process, and the electrically-conductive layer covering the first via-hole and a region of the second semiconductor layer located between a source electrode and a drain electrode, and connecting the contact layer and the source electrode or the drain electrode in the source/drain-electrode layer.

3. The method according to claim 2, further comprising steps of:
    forming a second passivation layer on a resultant substrate of the fourth patterning process, and performing a fifth patterning process so that a second via-hole is formed in the second passivation layer to at least expose a partial region of a gate line; and
    performing a sixth patterning process so that a first transparent electrically-conductive layer is formed on a resultant substrate of the fifth patterning process to cover the second via-hole.

4. The method according to claim 1, wherein the step of performing the first patterning process comprises steps of:
    forming the gate-electrode layer, a first semiconductor layer, a second transparent electrically-conductive layer and a photoresist on the substrate; and
    performing an exposure-and-development-process, an etching process and an ashing process on a resultant substrate of the step of forming the gate-electrode layer, the first semiconductor layer, the second transparent electrically-conductive layer and the photoresist on the substrate so that the gate-electrode and the photosensor are formed.

5. The method according to claim 4, wherein the step of performing the exposure-and-development-process comprises steps of:
    performing a partial exposing process on a photoresist located above the gate-electrode layer and a region of the contact layer which is not covered by the photosensor, so as to form a partially-exposed region;
    performing no exposing process on a photoresist located above the photosensor, so as to form a non-exposed region; and
    performing full exposing process on a photoresist located in regions other than the partially-exposed region and the non-exposed region so as to form a fully-exposed region.

6. The method according to claim 5, wherein the steps of performing the etching process and the ashing process comprises steps of:
    performing an etching process on the second transparent electrically-conductive layer in the photosensor with the photodiode structure so as to etch off the second transparent electrically-conductive layer in the fully-exposed region;
    performing an etching process on the first semiconductor layer in the photosensor with the photodiode structure so as to etch off the first semiconductor layer in the photosensor with the photodiode structure in the fully-exposed region;
    performing an etching process on the gate-electrode layer so as to etch off the gate-electrode layer in the fully-exposed region;
    removing the photoresist in the partially-exposed region in the ashing process;
    performing an etching process on the second transparent electrically-conductive layer in the photosensor with the photodiode structure so as to etch off the second transparent electrically-conductive layer in the partially-exposed region;
    performing an etching process on the first semiconductor layer in the photosensor with the photodiode structure so as to etch off the first semiconductor layer in the photosensor with the photodiode structure in the partially-exposed region; and
    stripping off a residual photoresist on the substrate completely.

7. The method according to claim 2, wherein the step of performing the first patterning process comprises following steps of:

forming the gate-electrode layer, a first semiconductor layer, a second transparent electrically-conductive layer and a photoresist on the substrate; and performing an exposure-and-development-process, an etching process and an ashing process on a resultant substrate of the step of forming the gate-electrode layer, the first semiconductor layer, the second transparent electrically-conductive layer and the photoresist on the substrate so that the gate-electrode, a gate-line contact layer and the photosensor are formed.

8. The method according to claim 7, wherein the step of performing the exposure-and-development-process comprises steps of:

performing a partial exposing process on a photoresist located above the gate-electrode layer, and a region of the contact layer which is not covered by the photosensor, so as to form a partially-exposed region;

performing no exposing process on a photoresist located above the photosensor, so that the photoresist located above the photosensor remains as a non-exposed region; and performing full exposing process on a photoresist located in regions other than the partially-exposed region and the non-exposed region so as to form a fully-exposed region.

9. The method according to claim 8, wherein the steps of performing the etching process and the ashing process comprises steps of:

performing an etching process on the second transparent electrically-conductive layer in the photosensor with the photodiode structure so as to etch off the second transparent electrically-conductive layer in the fully-exposed region;

performing an etching process on the first semiconductor layer in the photosensor with the photodiode structure so as to etch off the first semiconductor layer in the photosensor with the photodiode structure in the fully-exposed region;

performing an etching process on the gate-electrode layer so as to etch off the gate-electrode layer in the fully-exposed region;

removing the photoresist in the partially-exposed region in the ashing process;

performing an etching process on the second transparent electrically-conductive layer in the photosensor with the photodiode structure so as to etch off the second transparent electrically-conductive layer in the partially-exposed region;

performing an etching process on the first semiconductor layer in the photosensor with the photodiode structure so as to etch off the first semiconductor layer in the photosensor with the photodiode structure in the partially-exposed region; and stripping off a residual photoresist on the substrate completely.

10. The method according to claim 3, wherein the step of performing the first patterning process comprises following steps of:

forming the gate-electrode layer, a first semiconductor layer, a second transparent electrically-conductive layer and a photoresist on the substrate; and performing an exposure-and-development-process, an etching process and an ashing process on a resultant substrate of the step of forming the gate-electrode layer, the first semiconductor layer, the second transparent electrically-conductive layer and the photoresist on the substrate so that the gate-electrode, a gate-line contact layer and the photosensor are formed.

11. The method according to claim 10, wherein the step of performing the exposure-and-development-process comprises steps of:

performing a partial exposing process on a photoresist located above the gate-electrode layer, and a region of the contact layer which is not covered by the photosensor, so as to form a partially-exposed region;

performing no exposing process on a photoresist located above the photosensor, so as to form a non-exposed region; and performing full exposing process on a photoresist located in regions other than the partially-exposed region and the non-exposed region so as to form a fully-exposed region.

12. The method according to claim 11, wherein the steps of performing the etching process and the ashing process comprises steps of:

performing an etching process on the second transparent electrically-conductive layer in the photosensor with the photodiode structure so as to etch off the second transparent electrically-conductive layer in the fully-exposed region;

performing an etching process on the first semiconductor layer in the photosensor with the photodiode structure so as to etch off the first semiconductor layer in the photosensor with the photodiode structure in the fully-exposed region;

performing an etching process on the gate-electrode layer so as to etch off the gate-electrode layer in the fully-exposed region;

removing the photoresist in the partially-exposed region in the ashing process;

performing an etching process on the second transparent electrically-conductive layer in the photosensor with the photodiode structure so as to etch off the second transparent electrically-conductive layer in the partially-exposed region;

performing an etching process on the first semiconductor layer in the photosensor with the photodiode structure so as to etch off the first semiconductor layer in the photosensor with the photodiode structure in the partially-exposed region; and stripping off a residual photoresist on the substrate completely.

* * * * *